United States Patent
Hsieh

(10) Patent No.: US 8,101,993 B2
(45) Date of Patent: *Jan. 24, 2012

(54) MSD INTEGRATED CIRCUITS WITH SHALLOW TRENCH

(75) Inventor: Fu-Yuan Hsieh, Kaohsiung (TW)

(73) Assignee: Force Mos Technology Co., Ltd., Kaohsiung (TW)

( * ) Notice: Subject to any disclaimer, the term of this patent is extended or adjusted under 35 U.S.C. 154(b) by 145 days.

This patent is subject to a terminal disclaimer.

(21) Appl. No.: 12/382,509

(22) Filed: Mar. 18, 2009

(65) Prior Publication Data

US 2010/0237414 A1 Sep. 23, 2010

(51) Int. Cl.
*H01L 29/94* (2006.01)

(52) U.S. Cl. ............... 257/330; 257/331; 257/E29.183

(58) Field of Classification Search ............ 257/330, 257/331, E29.183

See application file for complete search history.

(56) References Cited

U.S. PATENT DOCUMENTS

| 6,806,574 | B2* | 10/2004 | Cho | 257/758 |
| 2002/0190313 | A1* | 12/2002 | Takaishi et al. | 257/330 |
| 2004/0065920 | A1* | 4/2004 | Henson | 257/330 |
| 2009/0224316 | A1* | 9/2009 | Bhalla et al. | 257/332 |
| 2010/0123185 | A1* | 5/2010 | Hsieh | 257/328 |

* cited by examiner

*Primary Examiner* — Phat X Cao
(74) *Attorney, Agent, or Firm* — Bacon & Thomas, PLLC

(57) ABSTRACT

A trench MOSFET device with embedded Schottky rectifier, gate-drain and gate-source diodes on single chip is formed with shallow trench structure to achieve device shrinkage and performance improvement. The present semiconductor devices achieve low Vf and reverse leakage current for embedded Schottky rectifier, have overvoltage protection for GS clamp diodes and avalanche protection for GD clamp diodes. More particularly, gate charge of the present semiconductor device is reduced due to the shallow trench surrounded by an additional N doped area around the bottom while keeping Rds low enough and at the same time, maintaining BV at a certain level.

30 Claims, 14 Drawing Sheets

Fig.1 (Pior Art)

MSD INTEGRATED CIRCUITS WITH SHALLOW TRENCH

FIELD OF THE INVENTION

This invention relates generally to the cell structure, device configuration and fabrication process of power semiconductor devices. More particularly, this invention relates to an improved cell configuration and processes to manufacture trench MOSFET device with Schottky rectifier, Gate-Drain (GD) and Gate-Source (GS) diodes with shallow trench structure on single chip for device shrinkage and performance improvement.

BACKGROUND OF THE INVENTION

As shown in FIG. 1, normally for high efficiency DC/DC application, a Schottky rectifier is externally added in parallel with a MOSFET device to prevent a parasitic P/N body diode in the MOSFET from turning on in order to achieve higher speed and efficiency. The requirement for the clamping effect is that the forward voltage of the Schottky rectifier Vf is less than the parasitic body PN diode (~0.7V). Besides the Schottky rectifier, a Gate-Source clamp diode with a breakdown voltage lower than the gate oxide rupture voltage of the MOSFET are provided for gate oxide ESD (electrostatic discharge) protection. Moreover, a Gate-Drain clamp diode with a breakdown voltage lower than that of the MOSFET are provided for Drain-Source avalanche protection. However, assembly of those separately structures into single package with extra interconnection wires results in higher manufacturing cost, and poor performance due to increase in inductance from the extra interconnection wires.

Another constraint is that, when fabricating the structure shown in FIG. 1, the conventional deep gate trenches are encountering a technical difficulty of high gate charge. The gate charge can be reduced simply by decreasing trench depth and P-body depth. However, the decreases may lead to increase of Rds, and lower breakdown voltage in termination if conventional field is used. As illustrated in FIG. 2, if the trench gate is not etched deep enough to a depth that the difference (Td−Pd) between trench depth Td and P-body depth Pd is less than 0.3 μm, Rds will be significantly increased. In FIG. 2, there are two curves, the upper one represents no As I/I at the bottom of the trench, and the lower one represents there is an additional n-dopant doped area surrounding bottom of trench and connecting to P-body region as shown in FIG. 3, which is our invention for resolving the Rds increasing issue due to shallow trench, and the difference between the two curves will be discussed below.

Accordingly, it would be desirable to provide more integrated trench MOSFET device with embedded Schottky rectifier, Gate-Drain and Gate-Source diodes on single chip for device shrinkage and performance improvement, and at the same time, having lower gate charge, lower Rds and higher breakdown voltage.

SUMMARY OF THE INVENTION

It is therefore an aspect of the present invention to provide improved semiconductor power device configuration and manufacture processes for providing trench MOSFET device with embedded Schottky rectifier, Gate-Drain and Gate-Source diodes with shallow trench structure on single chip so that space occupied can be reduced, and performance improved.

Another aspect of the present invention is to provide improved semiconductor power device configuration and manufacture processes for providing trench MOSFET devices with embedded Schottky rectifier on single chip.

Another aspect of the present invention is to provide improved semiconductor power device configuration and manufacture processes for providing trench MOSFET devices with embedded Schottky rectifier, Gate-Source diode on single chip.

Another aspect of the present invention is to provide improved semiconductor power device configuration and manufacture processes for providing trench MOSFET devices with embedded Schottky rectifier, Gate-Drain diode on single chip.

Another aspect of the present invention is to provide improved semiconductor power device configuration and manufacture processes for providing trench MOSFET devices with embedded Gate-Drain and Gate-Source diodes on single chip.

Another aspect of the present invention is to provide improved semiconductor power device configuration and manufacture processes for providing trench MOSFET devices with embedded Schottky rectifier, Gate-Drain and Gate-Source diodes with shallow trench structure on single chip so that the gate charge can be reduced.

Another aspect of the present invention is that, in conventional condition, the using of shallow trench will lead to the increase of Rds, as Rds is dependent on the difference between trench depth and P-body depth, but in accordance with the present invention, this problem could be solved by forming an n dopant implantation area surrounding the bottom of the trench and connecting to the P-body region, as shown in FIGS. 2 and 3, the area 700 is implanted with As, and its concentration is heavier than it of epitaxial layer, as illustrated in FIG. 4, the dashed line indicates the concentration of epitaxial layer, and it can be easily seen that the concentration of the n* area is heavier than that of the epitaxial layer. Refer to FIG. 2 again, the lower curve means the Rds is reduced when using the n* area surrounding the bottom of the trench.

Another aspect of the present invention is that the bottom of the trench is etched to be rounded instead of rectangular, by using of this method, the density of electrical field around the bottom of the trench is lower than the conventional structure, and the breakdown voltage is thus enhanced.

Briefly, in a preferred embodiment, the present invention discloses a semiconductor power device comprising a trench MOSFET with a trenched junction barrier Schottky rectifier and two diodes on single chip. The trenched junction barrier Schottky rectifier with a lower forward voltage is connected in parallel to the MOSFET as a clamp diode to prevent the parasitic PN body diode from turning on. The first Zener diode connects between a gate metal and a drain metal of said semiconductor power device functioning as a Gate-Drain clamp diode. The GD clamp diode further includes multiple back-to-back doped regions in a polysilicon layer doped with dopant ions of a first conductivity type next to a second conductivity type disposed on an insulation layer above the MOSFET device, having an avalanche voltage lower than a Source-Drain avalanche voltage of the MOSFET device wherein the Zener diode is insulated from a doped region of the MOSFET device. The second Zener diode connects between a gate metal and a source metal of the said MOSFET device for functioning as a Gate-Source clamp diode, wherein the GS clamp diode further includes multiple back-to-back doped regions in a polysilicon layer doped with dopant ions of a first conductivity type next to a second conductivity type disposed on an insulation layer above the MOSFET device, having a lower breakdown voltage than a gate oxide rupture voltage of the MOSFET device. An n* doped region surrounding the trench bottom and connecting to the P-body region, with a doping concentration heavier than that of epitaxial layer is formed to further reduce Rds. In an exemplary embodiment, the structure disclosed is the same as the structure mentioned in the first embodiment except that there is a trench Schottky diode functioning as a clamp diode in parallel to the MOSFET device with the parasitic PN body diode instead of the junction barrier Schottky rectifier.

These and other objects and advantages of the present invention will no doubt become obvious to those of ordinary skill in the art after having read the following detailed description of the preferred embodiment, which is illustrated in the various drawing figures.

DETAILED DESCRIPTION OF THE EMBODIMENTS

Figure 1:
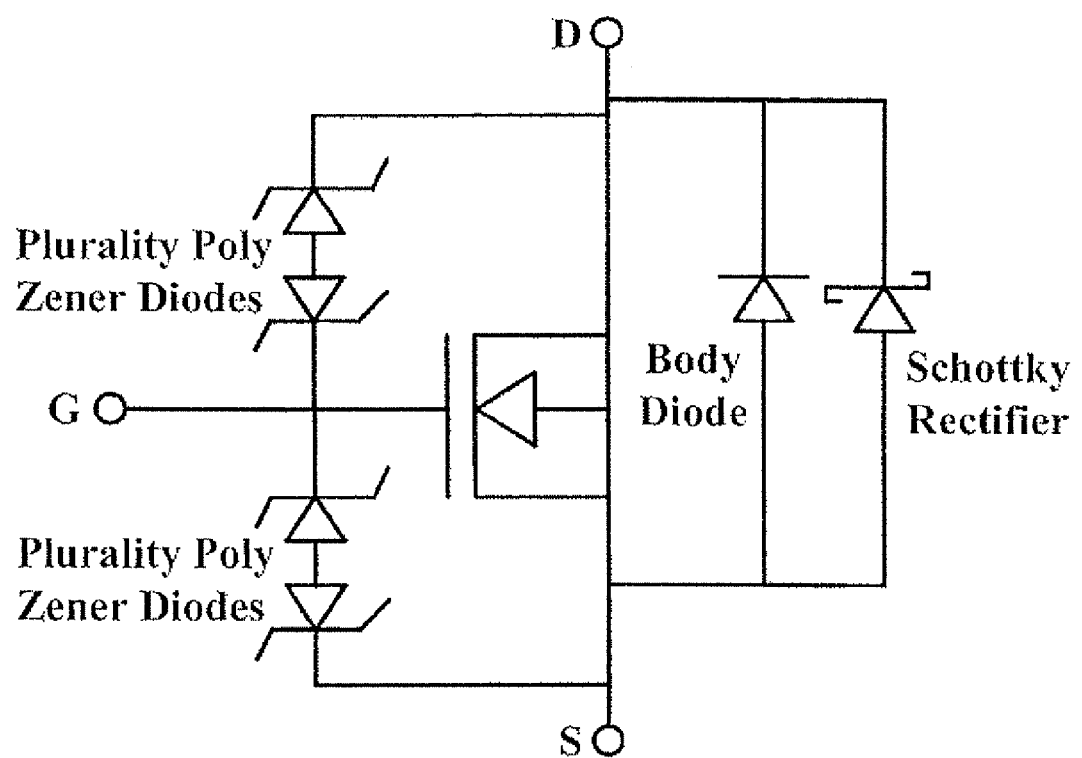
FIG. 1 is a conventional application circuit of the MOSFET power device with integration of Schottky rectifier, GD and GS diodes in single package.
Figure 2:
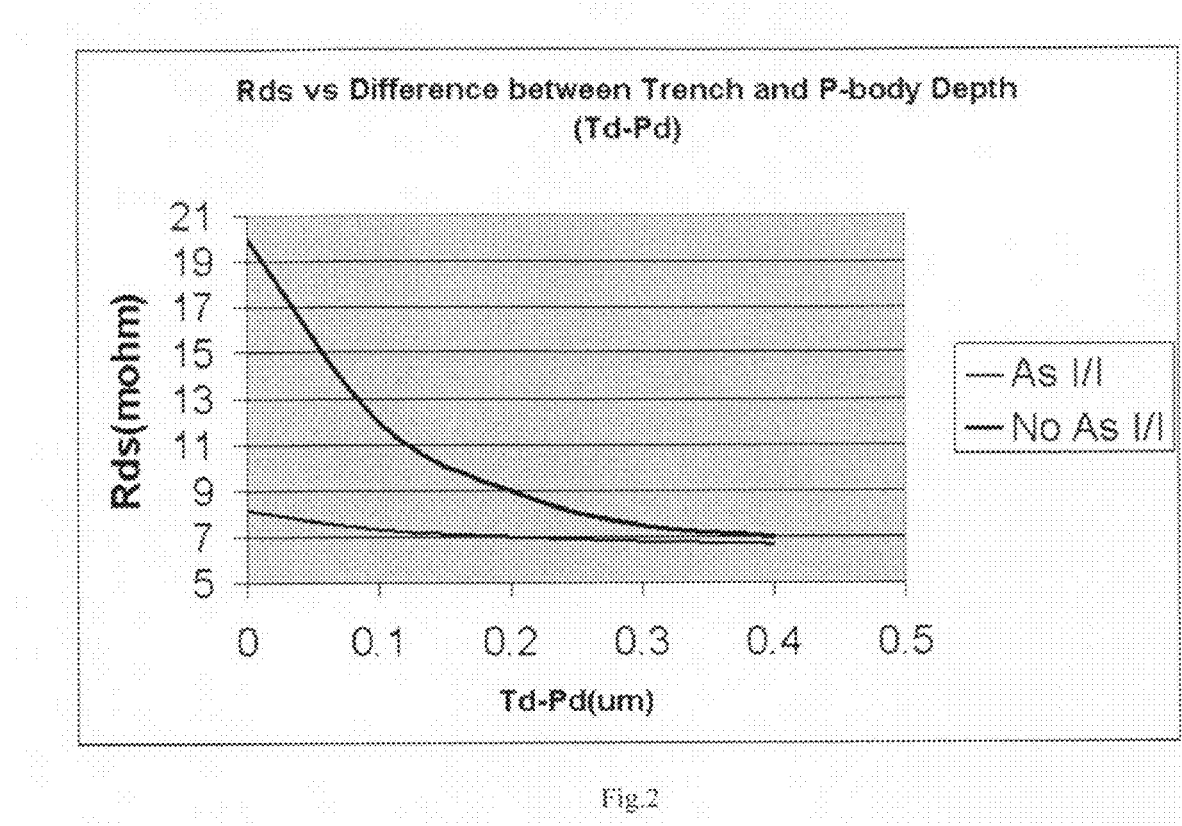
FIG. 2 is a profile showing the dependence of Rds on difference between trench depth and P-body depth. The upper curve indicates the condition with no arsenic implantation at the bottom of the trench, while the lower one indicates the condition with an N* area at the bottom of the trench.
Figure 3:
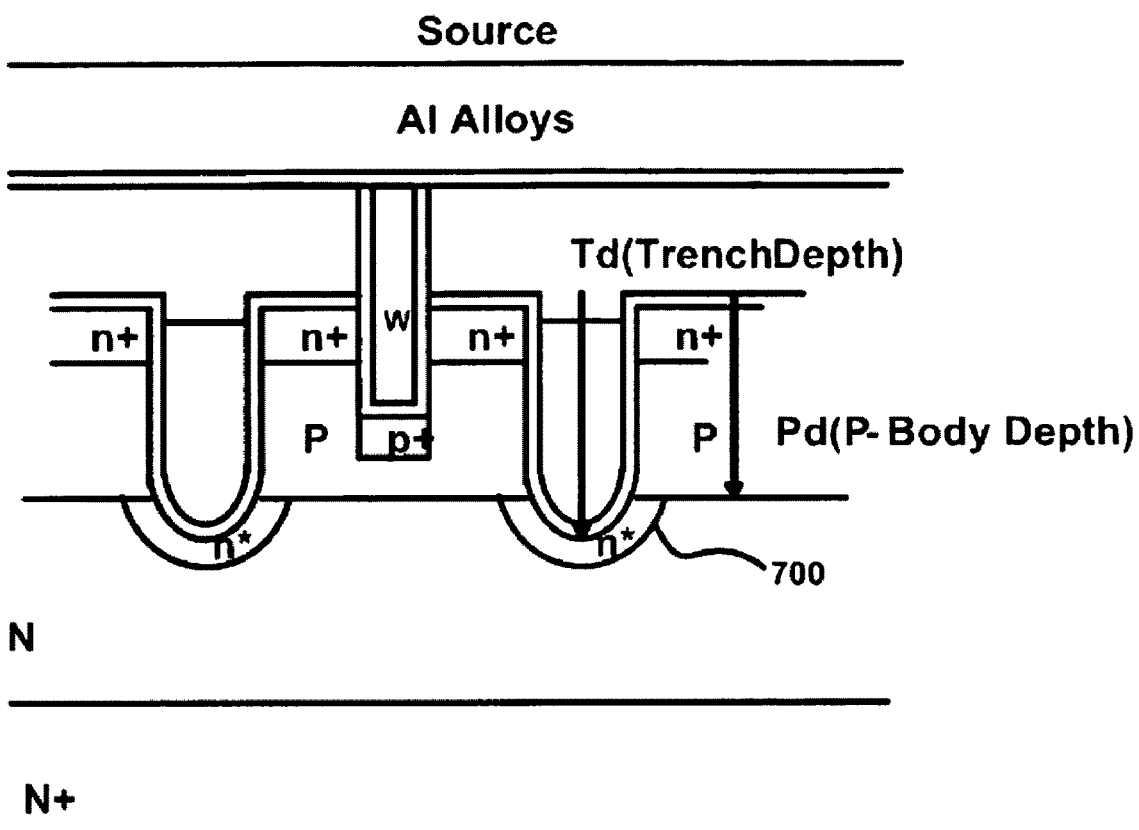
FIG. 3 is a cross-section of a cell portion of a power MOS element of the present invention.
Figure 4:
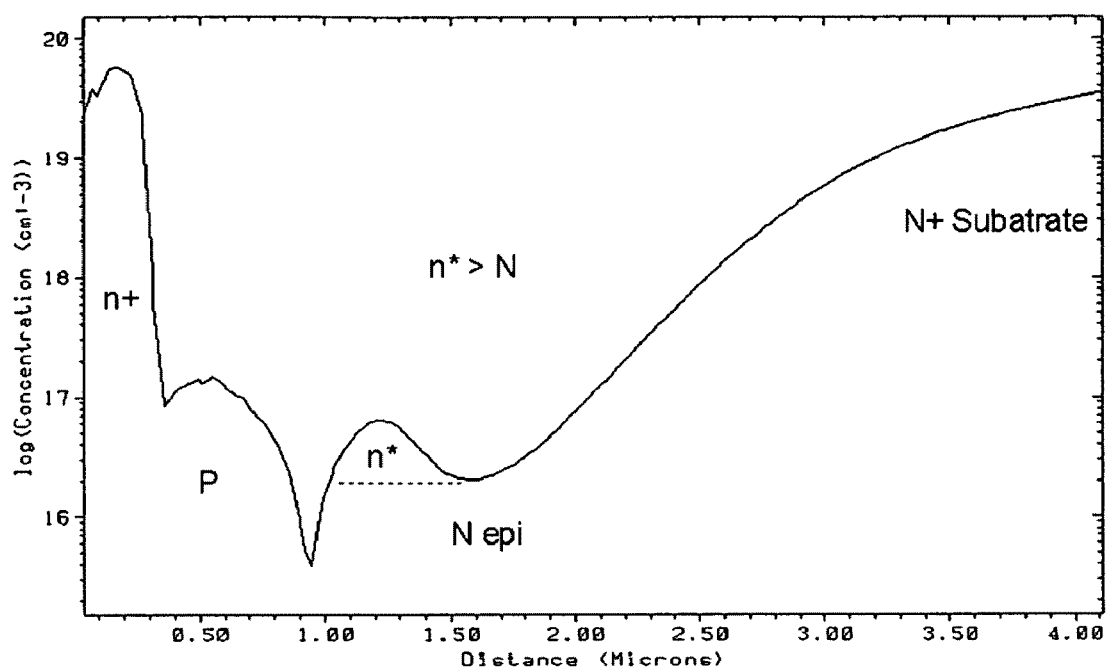
FIG. 4 is a profile illustrating the doping concentration distributed along channel region from silicon surface.
Figure 5A:
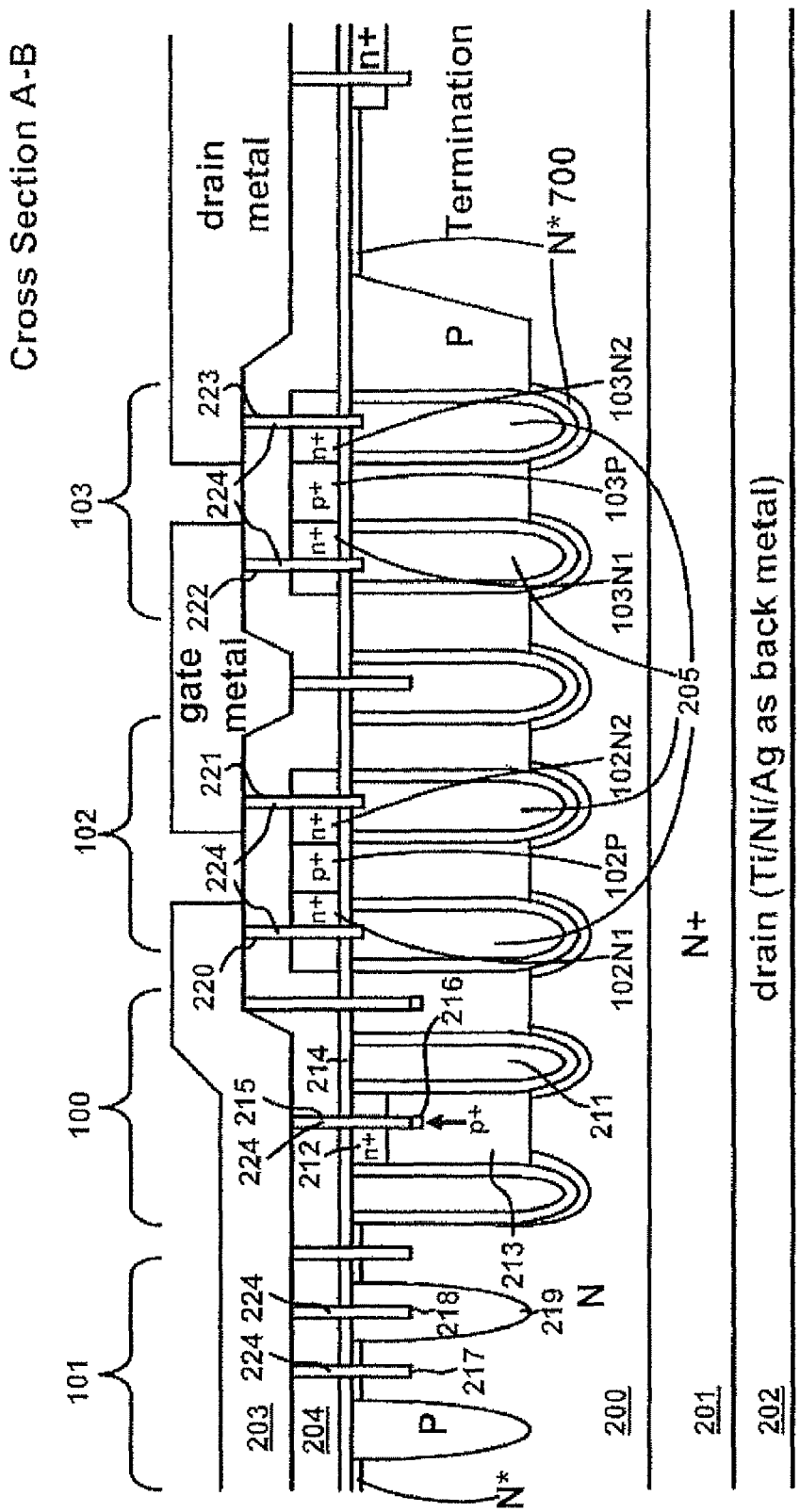
FIG. 5A is a cross-section of an integrated trench MOSFET with embedded junction barrier Schottky rectifier, GD and GS diodes with shallow trench structure of the first embodiment for the present invention. The cross section location is identified with A-B line of Top View in FIG. 5C
Figure 5B:
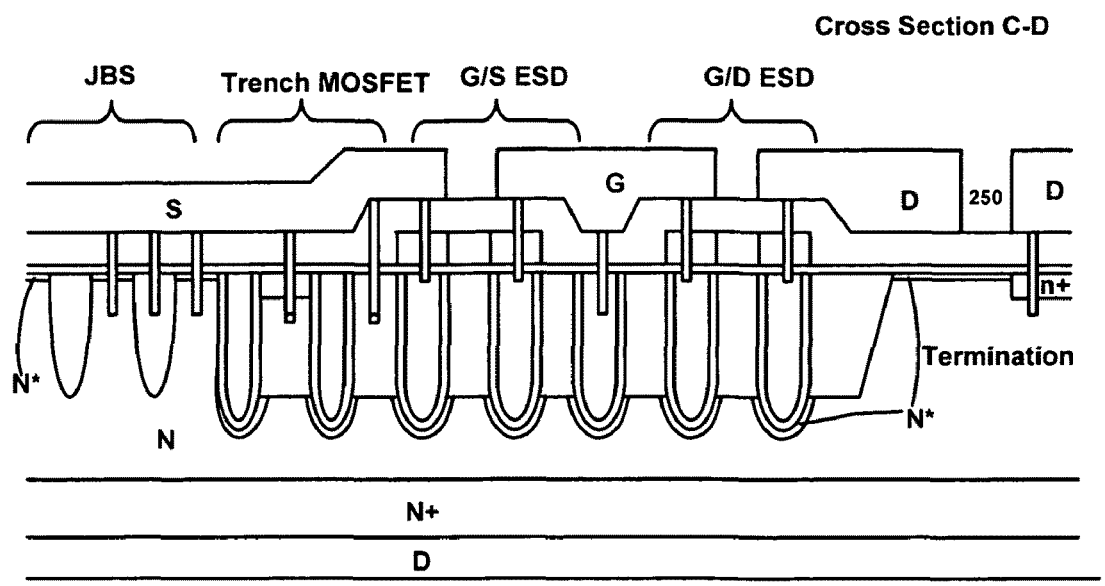
FIG. 5B is another cross-section of an integrated trench MOSFET with embedded junction barrier Schottky rectifier, GD and GS diodes with shallow trench structure of the first embodiment for the present invention. The cross section location is identified with C-D line of Top View in FIG. 5C
Figure 5C:
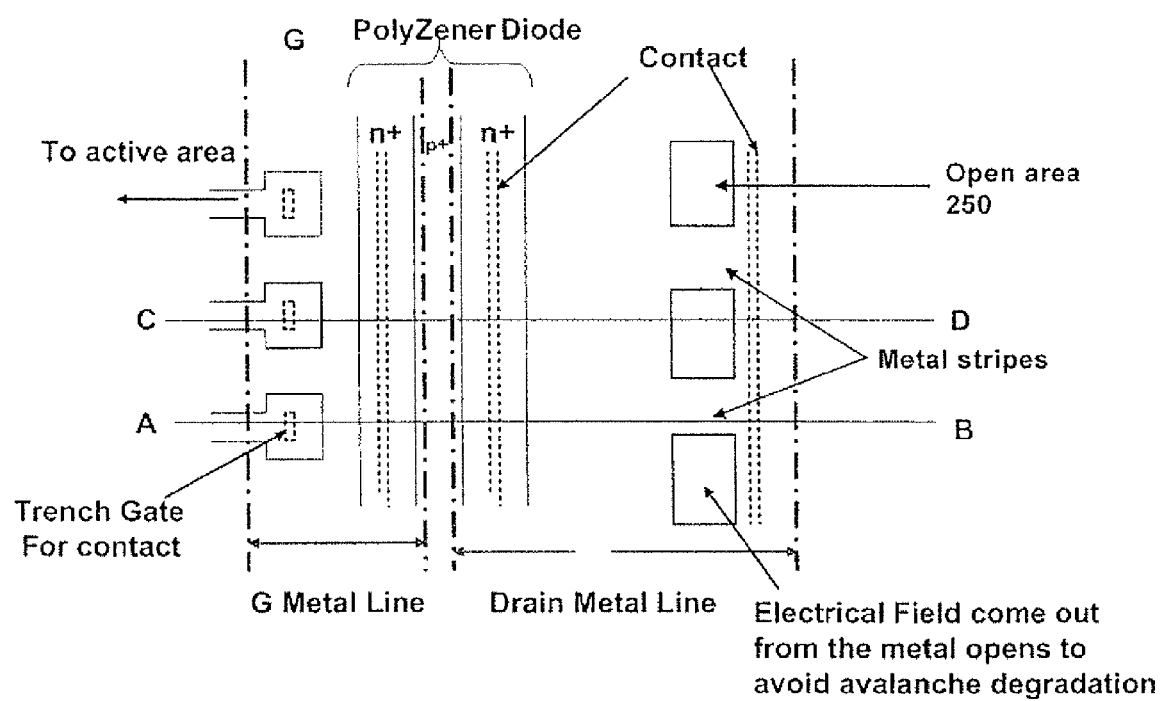
FIG. 5C is a top view of an integrated trench MOSFET with embedded Schottky rectifier, GD and GS diodes with shallow trench structure of the first embodiment for the present invention.

Please refer to FIGS. 5A to 5C for a first preferred embodiment of this invention. FIG. 5A is a cross-section A-B in FIG. 5C of this embodiment which shows a trenched MOSFET device 100 implemented with a junction barrier Schottky rectifier 101, Gate-Source polysilicon Zener clamp diodes 102 and Gate-Drain polysilicon Zener clamp diodes 103 formed in an N epitaxial layer 200 above a heavily N+ doped substrate 201 coated with back metal of Ti/Ni/Ag 202 on rear side as drain. In the trench MOSFET device 100, a trenched gate 211 surrounded by a source region 212 encompassed in a body region 213. An oxide layer 204 covering the trenched semiconductor power device with a source-body contact trench 215 opened through the source region 212 and extending into and body region 213 and filled with a tungsten plug 224 as a contact metal plug therein. A layer of Al Alloys or Copper 203 over a resistance reduction layer of Ti or Ti/TiN layer (not shown) serves as a source metal 203 on the oxide layer 204 deposited along the top surface of the insulation layer 214. The region 216 is heavily P doped to reduce the resistance between the tungsten plug 224 in the source-body contact trench 215 and said body region 213. In the junction barrier Schottky rectifier 101, a junction barrier Schottky contact trench 217 filled with the tungsten plug 224 as the contact metal plug is formed in said N epitaxial layer 220 and a contact trench 218 filled with the tungsten plug 224 formed in a P-well 219 adjacent to said junction barrier Schottky contact trench 217 connected to said source metal 203 serving as an anode of said Schottky rectifier. In order to provide the Gate-Source polysilicon Zener clamp diode 102 and the Gate-Drain polysilicon Zener clamp diode 103, a polysilicon layer are formed on said oxide layer 204 and doped as alternating N+ and P+ regions adjacent to each other. The N+ doped polysilicon regions 102N1, 102N2 and the P+ doped polysilicon region 102P constitute the GS polysilicon Zener clamp diode 102 while the N+ doped regions 103N1, 103N2 and the P+ doped polysilicon region 103P constitute the GD polysilicon Zener clamp diode 103. In the Gate-Source polysilicon Zener clamp diode, a first contact trench 220 filled with the tungsten plug 224 is formed to connect the source metal 203 with the N+ doped polysilicon region 102N1 of the Gate-Source polysilicon Zener clamp diode. A second contact trench 221 filled with the tungsten plug 224 is formed to connect a gate metal with the N+ doped polysilicon region 102N2 of the Gate-Source polysilicon Zener clamp diode. A third contact trench 222 filled with the tungsten plug 224 is formed to connect the gate metal with the N+ doped polysilicon region 103N1 of the Gate-Drain polysilicon Zener clamp diode 103. And a fourth contact trench 223 filled with the tungsten plug 224 is formed to connect the drain metal with the N+ doped polysilicon region 103N2 of the Gate-Drain polysilicon Zener clamp diode 103. A plurality of trenched gates 205 are formed right underneath the center of the contact trenches 220, 221 222 and 223 acting as a buffer layer to avoid the clamp diodes shorting with the P-body region 213. It should be noticed that, the trench bottom of each trenched gates 211 and 205, as shown in FIG. 5A, is designed to be rounded to form a shallow trench for further reducing gate charge. Underneath each trench bottom and a top surface of a termination area, an n* region 700 surrounding the trench bottom and connecting to the P-body region 213 is formed by arsenic Ion Implantation to further reduce Rds caused by decreasing the trench depth.

FIG. 5B is another cross-section C-D of the first embodiment as shown in FIG. 5C. The only difference between FIG. 5B and FIG. 5A is that there is an open area 250 of the drain metal on the top of the termination. A conventional metal field plate in the termination is provided to sustain breakdown voltage.

FIG. 5C is a top view of the first embodiment which shows Gate-Drain diode across termination with the open areas 250 in FIG. 5B of the drain metal having a plurality of metal stripe. Each of metal stripes is formed between two adjacent open areas 250 in the drain metal. These open areas 205 allow electrical field penetrate through the oxides during avalanche, and thus make benefits to avoid avalanche degradation caused by the metal field plate cross over the termination as shown in FIG. 5A.

Figure 6:
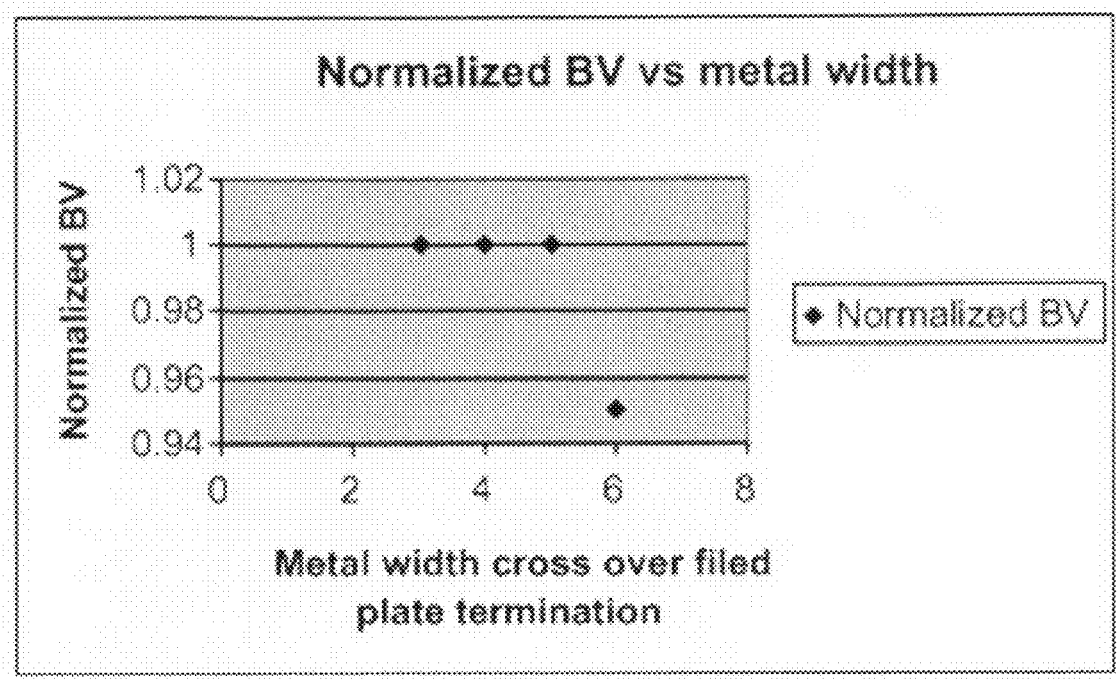
FIG. 6 is a normalized measurement result of the relationship between breakdown voltage and metal width cross over filed plate termination.

FIG. 6 is a normalized measurement result of the relationship between breakdown voltage and metal width of the metal stripes cross over metal field plate termination, which shows that breakdown voltage will be degraded when metal width W of the metal stripes is greater than 5 um, It means that electrical field underneath the cross-over metal can not effectively goes through the open area 250 if the metal width of the metal stripes is larger than 5 um.

Figure 7A:
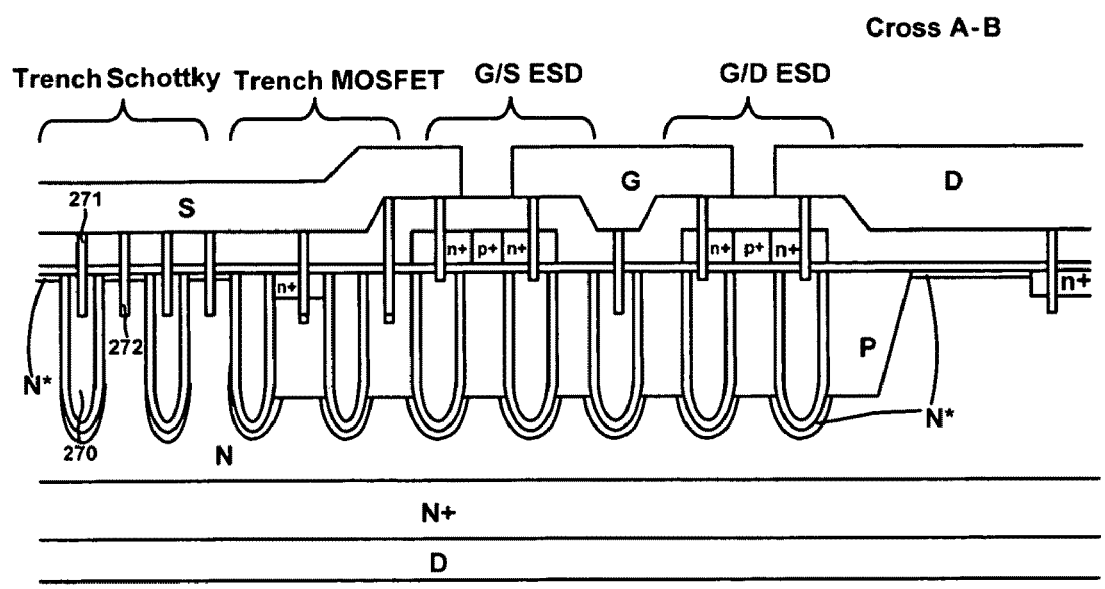
FIG. 7A is a cross-section of an integrated trench MOSFET with embedded trench Schottky rectifier, GD and GS diodes with shallow trench structure of another embodiment for the present invention. The cross section location is identified with A-B line of Top View in FIG. 5C

FIG. 7A is the cross-section A-B of the second embodiment of the present invention. The only difference between the structure of FIG. 7A and FIG. 5.A is that the embedded Schottky rectifier is a trench Schottky rectifier instead of junction barrier Schottky rectifier. The trench Schottky contact trench 272 is formed in said N epitaxial layer and other contact trench 271 formed in the trench gate 270 adjacent to said contact trench.

Figure 7B:
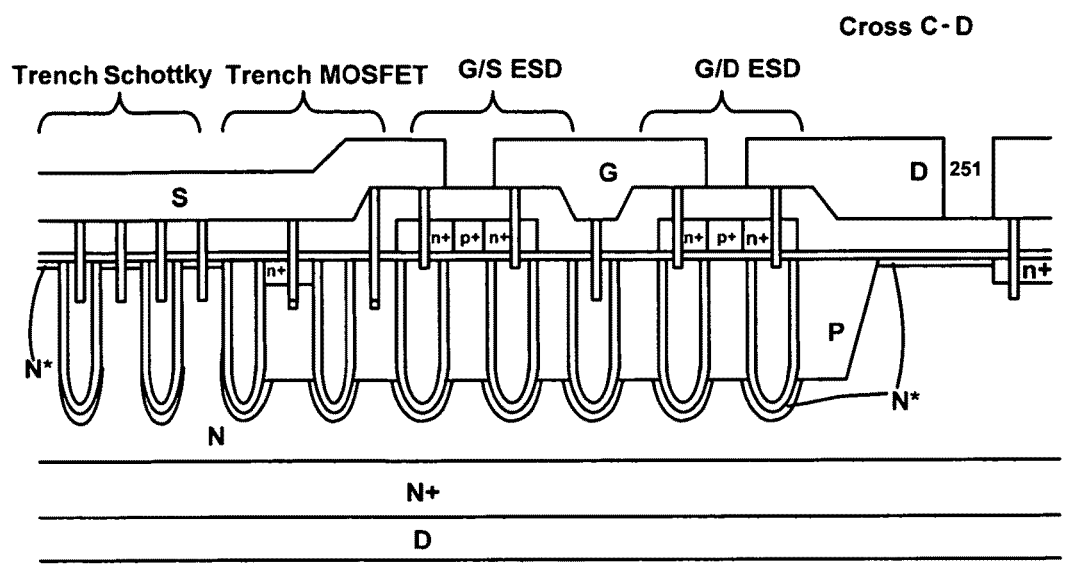
FIG. 7B is another cross-section of an integrated trench MOSFET with embedded trench Schottky rectifier, GD and GS diodes with shallow trench structure of the second embodiment for the present invention. The cross section location is identified with C-D line of Top View in FIG. 5C FIGS. 8A to 8D are a serial of side cross sectional views showing the processing steps for fabricating a MOSFET device as shown in FIG. 7A and FIG. 7B of this invention.

FIG. 7B is another cross-section C-D of the second embodiment. The only difference between FIG. 7B and FIG. 7A is that there is an open area 251 of the drain metal on the top of the termination.

Figure 8A:
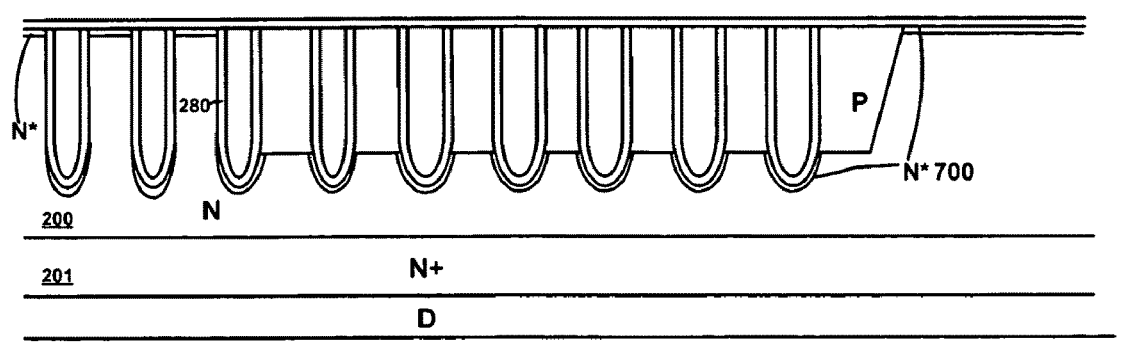

FIGS. 8A to 8D is a serial of exemplary steps that are performed to form the inventive device configuration of FIG. 7A. FIG. 8A shows that an N doped epitaxial layer 200 is grown on an N+ doped substrate 201. A trench mask (not shown) is applied to open a plurality of trenches by employing a dry silicon etch process. In order to remove the plasma damage introduced in etching said trenches, a sacrificial oxide layer is oxidized and then removed. A layer of screen oxide is grown for an Arsenic Ion Implantation process to form the N* region 700, and then removed to continue with the gate oxidation. After the formation of the gate oxide, doped poly is filled into the trenches and then etched back, serving as the gate material. A P-body mask is employed in the P-body Ion Implantation and followed by diffusion process to give a certain depth to form the body region 213, and an oxide layer 214 is grown on the top of the entire structure.

Figure 8B:
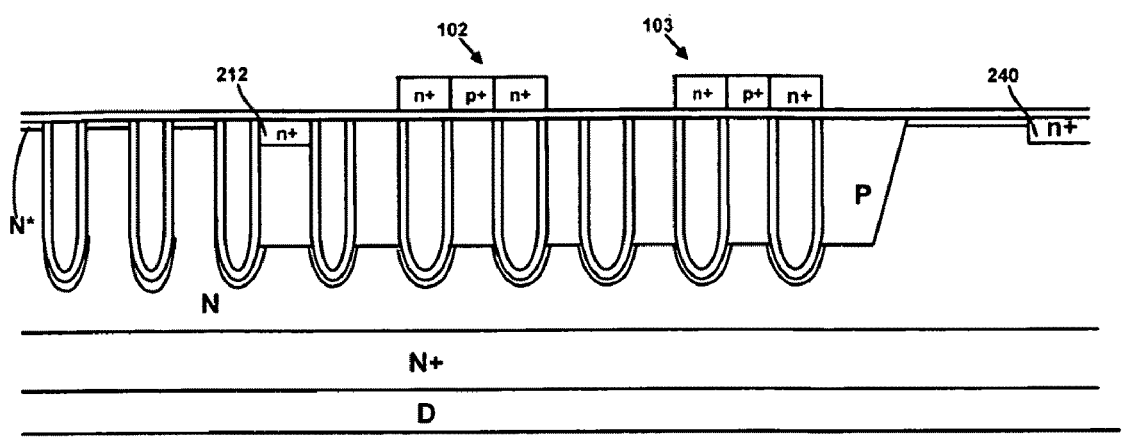

In FIG. 8B, a layer of undoped poly is deposited on the surface of the structure, and a poly mask is applied in a dry silicon etch process to form GS polysilicon Zener clamp diodes 102 and GD polysilicon Zener clamp diodes 103 after a Blank Boron Ion Implantation. Next, an N+ source mask is employed in the N+ source Ion Implantation and followed by diffusion process to give a certain depth to form the cathodes of said Zener clamp diodes, source region 212 and N+ region 240.

Figure 8C:
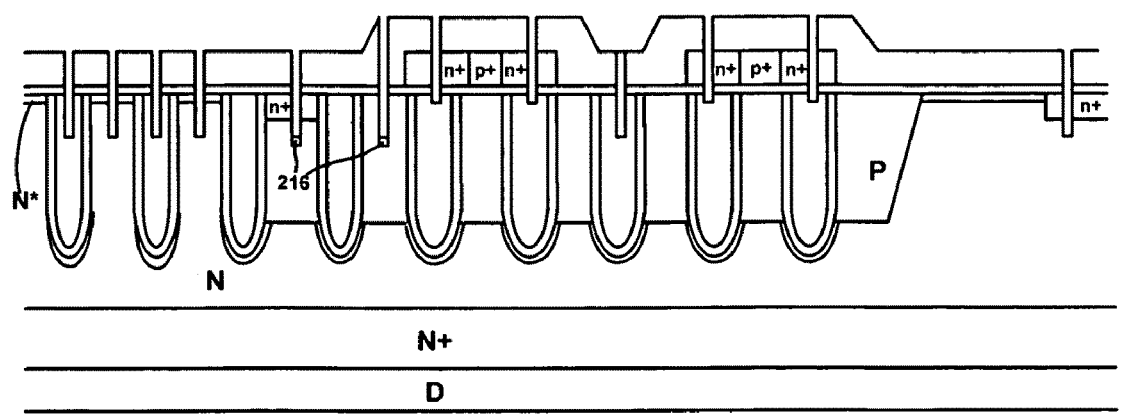

In FIG. 8C, an oxide layer is deposited to cover the entire structure, and a contact mask is employed in a dry silicon etch process. After the formation of all the contact trenches, a BF2 mask is employed in the BF2 Ion Implantation to form the more heavily doped region 216 to reduce the resistance between said trench contact metal plug and said body region.

Figure 8D:
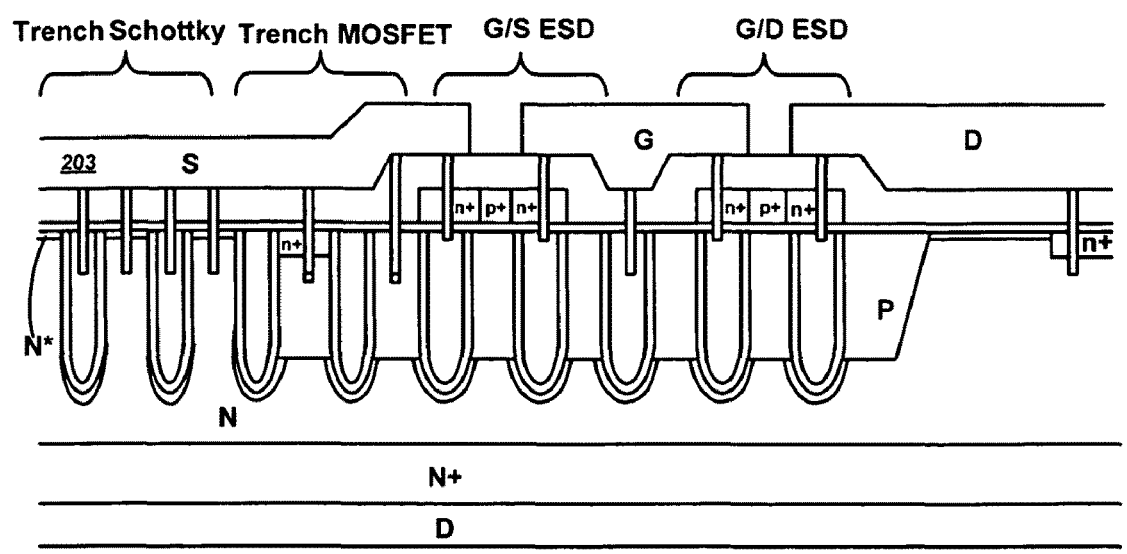

In FIG. 8D, a layer of Ti/TiN, Co/TiN or Mo/TiN (not shown) is deposited along the sidewall of each trench. To fill the contact trenches, tungsten is deposited serving as plug metal followed by a CMP process. Last, a metal mask is employed in the deposition process to form a layer of front metal of Al Alloys 203 above the entire structure.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprises a trench MOSFET, a Schottky rectifier, Gate-Drain and Gate-Source clamp diodes with a shallow trench structure for a device shrinkage and performance improvement on a single chip wherein:

a substrate of a first conductivity type;

an epitaxial layer of said first conductivity type over said substrate, said epitaxial layer having a lower doping than said substrate;

said trench MOSFET comprising a plurality of a first type trenched gates surrounded by source regions of said first conductivity type encompassed in body regions of a second conductivity type above first drain region disposed on a bottom surface of said substrate; a plurality of source-body contact trenches opened through said source regions and extending into said body regions, filled with a contact metal plug therein;

said Schottky rectifier extending into said epitaxial layer and having a Schottky barrier layer lined in trench contacts filled with said contact metal plug;

said Gate-Drain clamp diode compromises a plurality of back to back polysilicon zener diodes with dopant ions of said first conductivity type next to said second conductivity type, connecting to said trenched gate with one side, and to a second drain region on a top surface of said epitaxial layer in a termination area with another side through a plurality of metal stripes cross over said termination area;

said Gate-Source Clamp diode comprises a plurality of back to back polysilicon zener diodes with dopant ions of said first conductivity type next to said second conductivity type, connecting to said trenched gate with one side, and to said source region with another side;

a second type trench gates disposed right below the center of contact areas of said Gate-Drain and Gate-source Clamp diodes act as a buffer layer for prevention of shortage between said clamp diodes and said body regions; and a heavier doping region of said first conductivity type having a heavier doping concentration than said epitaxial layer, surrounding each trench bottom of said first type and second type trenched gates and connecting to said body regions.

2. The integrated circuits of claim 1 wherein:
said Schottky rectifier is a trench Schottky rectifier having a Schottky barrier layer of Ti/TiN, Co/TiN or Mo/TiN lined in said trench contact filled with said contact metal plug and between a pair of adjacent trenches.

3. The integrated circuits of claim 1 wherein:
said Schottky rectifier is a Junction Barrier Schottky rectifier having a Schottky barrier layer of Ti/TiN, Co/TiN or Mo/TiN lined in trench contact filled with said contact metal plug and between a pair of adjacent P wells.

4. The integrated circuits of claim 1 wherein:
said contact metal plug is tungsten (W) overlying a barrier layer of Ti/TiN, Co/TiN or Mo/TiN, and connected to an Al alloys or Copper source metal through a Ti or Ti/TiN layer for reduction of a contact resistance between said W and said source metal.

5. The integrated circuits of claim 1 wherein:
said contact metal plug is a source metal Al alloys overlying a barrier layer of Ti/TiN, Co/TiN or Mo/TIN.

6. The Integrated circuits device of claim 1 wherein:
said Gate-Drain and Gate-Source Clamp diodes comprising multiple back-to-back doped regions in said polysilicon layer doped with an N+ dopant next to a P dopant.

7. An integrated circuit comprises a trench MOSFET, a Schottky rectifier and a Gate-Source clamp diode with a shallow trench structure for a device shrinkage and performance improvement on a single chip wherein:
a substrate of a first conductivity type;
an epitaxial layer of said first conductivity type over said substrate, said epitaxial layer having a lower doping than said substrate;
said trench MOSFET comprising a plurality of a first type trenched gates surrounded by source regions of said first conductivity type encompassed in body regions of a second conductivity type above a drain region disposed on a bottom surface of said substrate; a plurality of source-body contact trenches opened through said source regions and extending into said body regions, filled with a contact metal plug therein;
said Schottky rectifier extending into said epitaxial layer and having a Schottky barrier layer lined in trench contacts filled with said contact metal plug;
said Gate-Source Clamp diode comprises a plurality of back to back polysilicon zener diodes with dopant ions of said first conductivity type next to said second conductivity type, connecting to said trenched gates with one side, and to said source region with another side;
a second type trench gates disposed right below the center of contact areas of said Gate-source Clamp diode act as a buffer layer for prevention of shortage between said clamp diode and said body regions; and
a heavier doping region of said first conductivity type having a heavier doping concentration than said epitaxial layer, surrounding each trench bottom of said first and second type trenched gates and connecting to said body regions.

8. The integrated circuits of claim 7 wherein:
said Schottky rectifier is a trench Schottky rectifier having a Schottky barrier layer of Ti/TiN, Co/TiN or Mo/TiN lined in said trench contact filled with said contact metal plug and between a pair of adjacent trenches.

9. The integrated circuits of claim 7 wherein:
said the Schottky rectifier is a Junction Barrier Schottky rectifier having a Schottky barrier layer of Ti/TiN, Co/TIN or Mo/TiN lined in trench contact filled with said contact metal plug and between a pair of adjacent P wells.

10. The integrated circuits of claim 7 wherein:
said contact metal plug is tungsten (W) overlying a barrier layer of Ti/TiN, Co/TiN or Mo/TIN, and connected to an Al alloys or Copper source metal through a Ti or Ti/TiN layer for reduction of a contact resistance between said W and said source metal.

11. The integrated circuits of claim 7 wherein:
said contact metal plug is a source metal Al alloys overlying a barrier layer of Ti/TiN, Co/TiN or Mo/TiN.

12. The Integrated circuits device of claim 7 wherein:
said Gate-Source Clamp diode comprising multiple back-to-back doped regions in said polysilicon layer doped with an N+ dopant next to a P dopant.

13. An integrated circuit comprises a trench MOSFET, a Schottky rectifier and a Gate-Drain clamp diode with a shallow trench structure for a device shrinkage and performance improvement on a single chip wherein:
a substrate of a first conductivity type;
an epitaxial layer of said first conductivity type over said substrate, said epitaxial layer having a lower doping than said substrate;
said trench MOSFET comprising a plurality of a first type trenched gates surrounded by a source regions of said first conductivity type encompassed in body regions of a second conductivity type above first drain region disposed on a bottom surface of a said substrate; a plurality of source-body contact trenches opened through said source regions and extending into said body regions, filled with a contact metal plug therein;
said Schottky rectifier extending into said epitaxial layer and having a Schottky barrier layer lined in trench contacts filled with said contact metal plug;
said Gate-Drain clamp diode comprises a plurality of back to back polysilicon zener diode with dopant ions of said first conductivity type next to said second conductivity type, connecting to said trenched gate with one side, and to a second drain region on top surface of said epitaxial layer in a termination area with another side through a plurality of metal stripes cross over said termination area; and
a second type trench gates disposed right below the center of contact areas of said Gate-Drain clamp diode act as a buffer layer for prevention of shortage between said clamp diode and said body regions; and
a heavier doping region of said first conductivity type having a heavier doping concentration than said epitaxial layer, surrounding each trench bottom of said first and second type trenched gates and connecting to said body region.

14. The integrated circuits of claim 13 wherein:
said Schottky rectifier is a trench Schottky rectifier having a Schottky barrier layer of Ti/TIN, Co/TiN or Mo/TiN lined in said trench contact filled with said contact metal plug and between a pair of adjacent trenches.

15. The integrated circuits of claim 13 wherein:
said the Schottky rectifier is a Junction Barrier Schottky rectifier having a Schottk barrier layer of Ti/TiN, Co/TIN or Mo/TiN lined in trench contact filled with said contact metal plug and between a pair of adjacent P wells.

16. The integrated circuits of claim 13 wherein:
said contact metal plug is tungsten (W) overlying a barrier layer of Ti/TiN, Co/TiN or Mo/TiN, and connected to an Al alloys or Copper source metal through a Ti or Ti/TiN layer for reduction of a contact resistance between said W and said source metal.

17. The integrated circuits of claim 13 wherein:
said contact metal plug is a source metal Al alloys overlying said a barrier layer of Ti/TIN, Co/TIN or Mo/TIN.

18. The Integrated circuits device of claim 13 wherein:
said Gate-Drain clamp diode comprising multiple back-to-back doped regions in said polysilicon layer doped with an N+ dopant next to a P dopant.

19. An integrated circuit comprises trench MOSFET, Gate-Drain and Gate-Source clamp diodes with a shallow trench structure for a device shrinkage and performance improvement on a single chip wherein:
a substrate of a first conductivity type;
an epitaxial layer of said first conductivity type over said substrate, said epitaxial layer having a lower doping than said substrate;

said trench MOSFET comprising a plurality of a first type trenched gates surrounded by source regions of said first conductivity type encompassed in body regions of a second conductivity type above a first drain region disposed on a bottom surface of said substrate; a plurality of source-body contact trenches opened through said source regions and extending into said body regions, filled with a contact metal plug therein;

said Gate-Drain clamp diode comprises a plurality of back to back polysilicon zener diodes with dopant ions of said first conductivity type next to said second conductivity type, connecting to said trenched gate with one side, and to second drain region on a top surface of said epitaxial layer in a termination area with another side through a plurality of metal stripes cross over said termination area;

said Gate-Source Clamp diode comprises a plurality of back to back polysilicon zener diodes with dopant ions of said first conductivity type next to said second conductivity type, connecting to said trenched gates with one side, and to said source region with another side;

a second type trench gates disposed right below the center of contact areas of said Gate-Drain and Gate-source Clamp diodes act as a buffer layer for prevention of shortage between said clamp diodes and said body regions; and a heavier doping region of said first conductivity type having a heavier doping concentration than said epitaxial layer, surrounding each trench bottom of said first and second type trenched gates and connecting to said body region.

20. The integrated circuits of claim 19 wherein:
said contact metal plug is tungsten (W) overlying a barrier layer of Ti/TiN, Co/TiN or Mo/TiN, and connected to an Al alloys or Copper source metal through a Ti or Ti/TiN layer for reduction of a contact resistance between said W and said source metal.

21. The integrated circuits of claim 19 wherein:
said contact metal plug is a source metal Al alloys overlying a barrier layer of Ti/TiN, Co/TiN or Mo/TiN.

22. The Integrated circuits device of claim 19 wherein:
said Gate-Drain and Gate-Source Clamp diodes comprising multiple back-to-back doped regions in said polysilicon layer doped with an N+ dopant next to a P dopant.

23. An integrated circuit comprises a trench MOSFET and a Gate-Source clamp diode with a shallow trench structure for a device shrinkage and performance improvement on a single chip wherein:
a substrate of a first conductivity type;
an epitaxial layer of said first conductivity type over said substrate, said epitaxial layer having a lower doping than said substrate;
said trench MOSFET comprising a plurality of a first type trenched gates surrounded by source regions of said first conductivity type encompassed in body regions of a second conductivity type above first drain region disposed on a bottom surface of said substrate; a plurality of source-body contact trenches opened through said source regions and extending into said body regions, filled with a contact metal plug therein;
said Schottky rectifier extending into said epitaxial layer and having a Schottky barrier layer lined in trench contacts filled with said contact metal plug;
said Gate-Source Clamp diode comprises a plurality of back to back polysilicon diodes with dopant ions of said first conductivity type next to said second conductivity type, connecting to said trenched gate with one side, and to said source region with another side;
a second type trench gates disposed right below the center of contact areas of said Gate-source Clamp diode act as a buffer layer for prevention of shortage between said clamp diodes and said body regions; and
a heavier doping region of said first conductivity type having a heavier doping concentration than said epitaxial layer, surrounding each trench bottom of said first and second type trenched gates and connecting to said body regions.

24. The Integrated circuits device of claim 23 wherein:
said Gate-Source Clamp diode comprising multiple back-to-back doped regions in said polysilicon layer doped with an N+ dopant next to a P dopant.

25. The integrated circuits of claim 23 wherein:
said contact metal plug is tungsten (W) overlying a barrier layer of Ti/TiN, Co/TiN or Mo/TiN, and connected to an Al alloys or Copper source metal through a Ti or Ti/TiN layer for reduction of a contact resistance between said W and said source metals.

26. The integrated circuits of claim 23 wherein:
said contact metal plug is a source metal Al alloys overlying a barrier layer of Ti/TiN, Co/TiN or Mo/TiN.

27. An integrated circuit comprises a trench MOSFET and a Gate-Drain clamp diode with a shallow trench structure for a device shrinkage and performance improvement on a single chip wherein:
a substrate of a first conductivity type;
an epitaxial layer of said first conductivity type over said substrate, said epitaxial layer having a lower doping than said substrate;
a said trench MOSFET comprising a plurality of a first type trenched gates surrounded by a source regions of said first conductivity type encompassed in a body regions of a second conductivity type above first drain region disposed on a bottom surface of said substrate; a plurality of source-body contact trenches opened through said source regions and extending into said body regions, filled with a contact metal plug therein;
said Gate-Drain clamp diode comprises a plurality of back to back polysilicon zener diodes with dopant ions of said first conductivity type next to said second conductivity type, connecting to said trenched gate with one side, and to second drain region on a top surface of said epitaxial layer in a termination area with another side through a plurality of metal stripes cross over said termination area; and
a second type trench gates disposed right below the center of contact areas of said Gate-Drain clamp diode act as a buffer layer for prevention of shortage between said clamp diode and said body regions; and
a heavier doping region of said first conductivity type having heavier doping concentration than said epitaxial layer, surrounding each trench bottom of said first and second type trenched gates and connecting to said body region.

28. The integrated circuits of claim 27 wherein:
said contact metal plug is tungsten (W) overlying a barrier layer of Ti/TiN, Co/TiN or Mo/TiN, and connected to an Al alloys or Copper source metal through a Ti or Ti/TiN layer for reduction of a contact resistance between said W and said source metal.

29. The integrated circuits of claim 27 wherein:
said contact metal plug is a source metal Al alloys overlying a barrier layer of Ti/TiN, Co/TiN or Mo/TiN.

30. The Integrated circuits device of claim 27 wherein:
said Gate-Drain Clamp diode comprising multiple back-to-back doped regions in said polysilicon layer doped with an N+ dopant next to a P dopant.

* * * * *